United States Patent [19]
Myers

[11] Patent Number: 4,992,747
[45] Date of Patent: Feb. 12, 1991

[54] MULTIPLE REUSE OF AN FM BAND

[76] Inventor: Glen A. Myers, 279 Laureles Grade Rd., Salinas, Calif. 93908

[21] Appl. No.: 352,400

[22] Filed: May 15, 1989

Related U.S. Application Data

[63] Continuation-in-part of Ser. No. 232,691, Aug. 16, 1988, Pat. No. 4,859,958.

[51] Int. Cl.$^5$ .............................................. H03D 3/00
[52] U.S. Cl. .................................... 329/316; 329/325; 329/336; 455/206
[58] Field of Search ............... 329/316, 320, 325, 336; 331/2; 455/206, 209, 265, 305, 306, 312

[56] References Cited

U.S. PATENT DOCUMENTS 4,027,264 5/1977 Gutleber ......................... 455/206 X
4,453,137 6/1984 Rittenbach ............................. 331/2

OTHER PUBLICATIONS

Baghdady, Elie J., "New Developments in FM Reception and Their Application to the Realization of a System or Power-Division Multiplexing", Sep. 1959, published in IRE Transactions on Communications Systems, pp. 147–161.

*Primary Examiner*—David Mis
*Attorney, Agent, or Firm*—Schroeder, Davis & Orliss Inc.

[57] ABSTRACT

A signal receiving system for receiving messages from each of several unequal amplitude FM carriers occupying the same portion of the frequency band. The signal receiving system receives power division multiplexed signals, each of which being allocated a portion of the total average power of an assigned FM band.

17 Claims, 3 Drawing Sheets

MULTIPLE REUSE OF AN FM BAND

CROSS REFERENCE TO RELATED APPLICATION

This is a continuation-in-part of application Ser. No. 232,691, filed Aug. 16, 1988, now U.S. Pat. No. 4,859,958.

BACKGROUND OF THE INVENTION

This invention relates generally to frequency modulation (FM) radio systems, more particularly, systems for receiving all desired broadcast messages from multiple FM carriers of unequal amplitude. In addition, an inherent feature of the present invention is that all suppressed signals, both carrier and modulation, are recoverable to substantially the same extent.

In a conventional frequency modulation (FM) radio receiver, the demodulator circuit suppresses weaker FM signals. The receiver is said to be captured by the strongest signal and all presently known FM demodulators exhibit this "capture effect." Capture effect, a weak-signal-suppression characteristic, is a well-known property of frequency modulation theory The prior art includes work by E. J. Baghdady as described in "Signal Cancellation Techniques for Capturing the Weaker of Two Co-Channel FM Signals", Electro-Magnetic Wave Propagation, 1960, pages 183–207, Academic Press. Two signal cancellation techniques were discussed, namely, (1) dynamic trapping and (2) feed-forward.

Dynamic trapping attempts to reduce the amplitude of the stronger signal by tuning an electrical bandpass filter. The filter reduces the signal strength of the stronger signal so that it becomes the weaker signal. A conventional demodulator is then used to recover the message from its dominant input, which was originally the weaker desired signal. The theoretical performance of the dynamic trapping technique is uncertain, since it appears to require that the concepts of instantaneous frequency and Fourier transform frequency be equated. Therefore, Baghdady relies on experimental results.

The feed-forward technique uses signal suppression provided by narrow band limiters. Such limiters are also difficult to analyze mathematically and again, Baghdady relies on experimental results for supporting this technique. By the very principles of their operation, neither dynamic trapping nor feed-forward function as intended when the instantaneous frequency of the applied FM signals are equal or approximately equal.

The prior art also includes U.S. Pat. Nos. 3,226,646—Ludwig, 3,753,123—Carpenter, et. al, and 4,739,518—Bickley, et. al. All of these references attempt to recover information from a weaker signal in the presence of one or more stronger signals by signal cancellation and related filtering techniques.

In Ludwig, a cancellation bridge is used for cancellation of interfering signals and employs a strong signal tracking filter for isolating the interference. The tracking filter incorporates a high signal capture-type demodulator, which provides an instantaneous analog signal for controlling coincidence of the instantaneous center frequency of an electronically tunable filter with the frequency of the undesired stronger signal. Only one output, namely the demodulated weaker signal, is obtained. Again, the concepts of instantaneous frequency and Fourier transform frequency are equated to explain the operation.

Carpenter, et. al., describes a system for subtracting unwanted signals from input signals to provide error signals at the output. This reference also teaches use of a phase-locked loop (PLL) in signal extraction means for producing an estimate signal, which includes any incidental amplitude variations of the carrier signal, and which is vectorially subtracted from the input signal. More than one estimate signal may be derived for vector subtraction and, since each extractor remains locked on its own signal, the effect of removing one or more input signals by such subtraction has little or no effect on the remaining signals. Cancellation only of undesired signals is provided Finally, in Bickley et. al., the capture effect of a limiter is used to detect a desired signal received with an interfering signal at nearly the same frequency as the desired signal but at significantly greater amplitude. In the described system, a gain-controlled amplifier provides a constant amplitude signal having the amplitude of the interfering signal portion equal to the amplitude of the interfering signal portion produced by the limiter. The constant amplitude and limiter signals combine through a subtraction operation to effectively cancel the interfering signal while causing only small attenuation of the desired signal. Again, only suppression of undesired signals is described.

None of these references apparently appreciate other advantages and uses of capture effect of FM demodulators. In addition, while Carpenter, et. al, uses a phase-locked loop (PLL) in extracting signals from input signals, none of the references appreciate other advantages and uses of phase-locked loop technology for discriminating more than one signal component of the input signal.

SUMMARY OF THE INVENTION

In the present invention, capture effect associated with frequency demodulators is used in cooperation with phase-locked loops in a new demodulator to provide improved demodulation of all of several FM carriers including weaker signals in the presence of dominant carriers. A frequency demodulator converts the instantaneous frequency of the applied signal to a voltage. When the sum of two or more signals is present at the input to the demodulator of the present invention, the output voltage $m_0(t)$ is proportional to the instantaneous frequency of the dominant portion of the input signal. Thus, the dominant signal is said to capture the demodulator.

When $m_0(t)$ is used to frequency modulate another sinusoid, then a replica of the original dominant signal is created in the receiver. The replica signal is now isolated from the other weaker receiver input signals and can be subtracted from the composite input to effectively suppress the dominant signal. After subtraction, weaker carriers of the input signal remain. The remaining signal then can be successively demodulated in the same way virtually as many times as desired for demodulation of as many component carriers of the input signal as desired.

For effective cancellation using the present invention, the carrier frequency and the extent of modulation of the replica signal must be substantially the same as the dominant signal. In practice, it is not possible to achieve this condition using a conventional signal source and frequency modulator. However, by using a voltage-controlled oscillator (VCO) in a PLL, near-exact replication of the dominant signal is possible. Thus, when the phase-locked loop is operated as a frequency demodulator, the output of the VCO is the replica of the dominant input signal to be cancelled.

Recovery of weaker signal information is inherent in the design of a signal receiving system constructed according to the principles of the present invention. A plurality of output signals representing the messages contained in the modulation of a succession of dominant input signals, derived from remaining components of the original input signal in descending order of dominance, is obtainable from each phase-locked loop demodulator comprising the signal receiving system of the present invention. Consequently, this invention makes possible multiple reuse of FM bands, that is, several FM carriers having unrelated messages can coexist in the same frequency band with all or selected messages being recoverable by application of this invention.

The present invention permits and includes the concept of power division multiplexing whereby a number of messages (customers) share transmitter power with each other using the same frequency band simultaneously. This concept is consistent with other well understood and implemented techniques such as time division multiplexing and frequency division multiplexing.

DESCRIPTION OF THE PREFERRED EMBODIMENT

Figure 1:
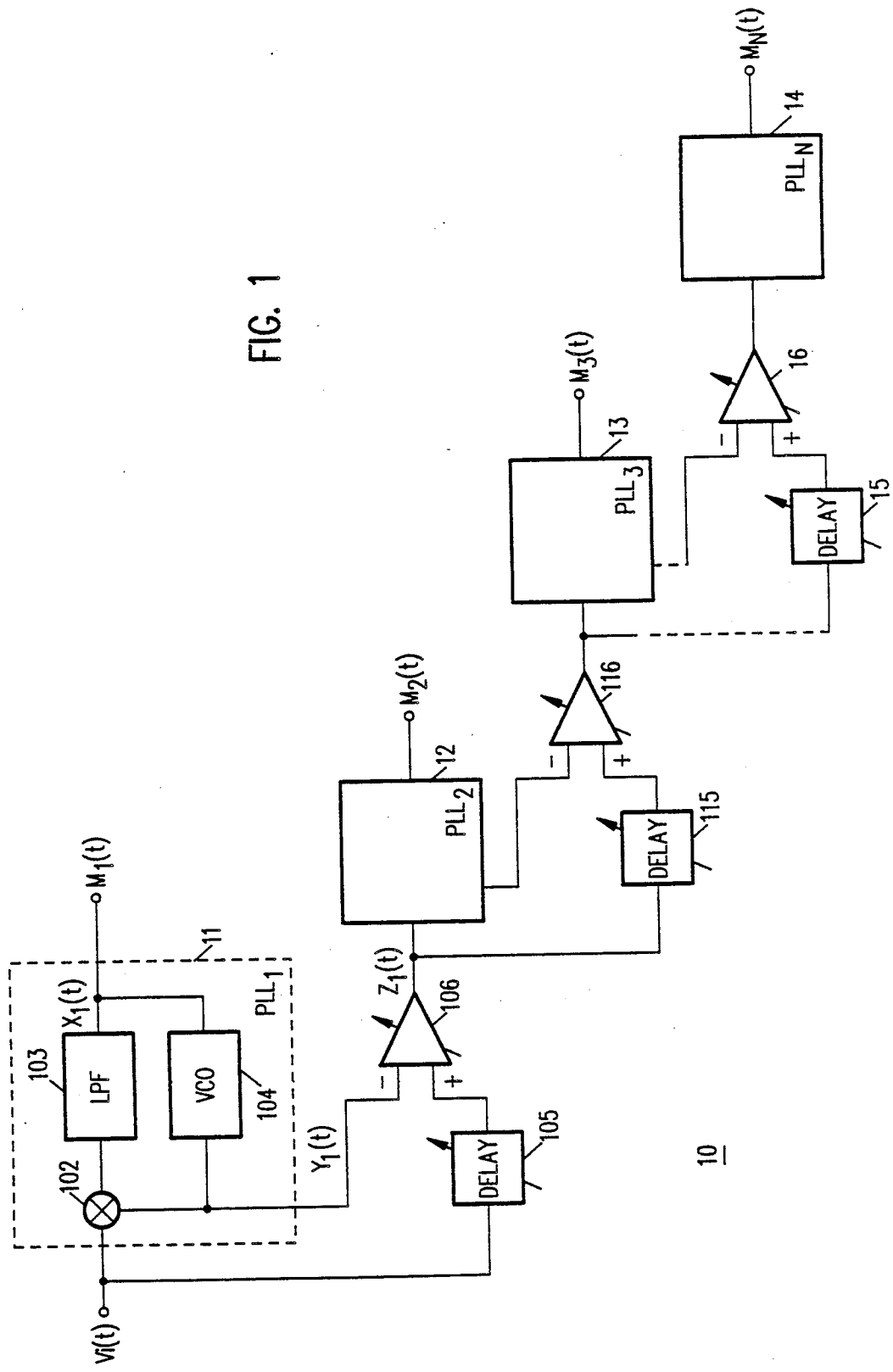
FIG. 1 is a block diagram of a signal receiving system constructed according to the principles of the present invention.

Referring to FIG. 1, signal receiving system 10 comprises a plurality of PLL demodulators, each of which includes a mixer, lowpass filter (LPF) and VCO. The system further includes pluralities of variable delays and variable-gain difference amplifiers coupled, respectively, to each of the phase-locked loop demodulators as shown and further described elsewhere in this specification.

With the continuing reference to FIG. 1, input signal $V_i(t)$, is assumed to include many FM carrier signals of various strengths and will be described in more detail elsewhere in this specification. The receiving system of the present invention may be connected to the front end, i.e. radio frequency (RF) antenna, RF amplifier, mixer and intermediate frequency (IF) amplifier, of any conventional superheterodyne radio receiver In such systems, the mixer down converts received RF energy into a received IF signal. Typically, the received IF signal preserves the signal-to-interference ratio of the received RF energy, and the frequencies of the desired as well as interfering signals. Thus, frequency components of the RF energy are preserved in the IF signals.

Phase-locked loop 11 (also referred to as $PLL_1$) comprises mixer 102, LPF 103 and VCO 104. One input of mixer 102 is coupled to the input signal $V_i(t)$. The output of mixer 102 is coupled to the input of LPF 103. The output of LPF 103 is coupled to the input of VCO 104 and produces message information $m_1(t)$ demodulated from the most dominant FM signal. The output of VCO 104 is applied to another input of mixer 102 and to the input of difference amplifier 106.

$PLL_2$, $PLL_3$ ... $PLL_n$ are essentially the same circuits as that just described for $PLL_1$.

The input signal is also applied to the input of variable delay 105. The outputs of delay 105 and VCO 104 are applied to the inputs of variable-gain difference amplifier 106. The output of amplifier 106 comprises input signal $V_i(t)$, with the most dominant carrier suppressed. Demodulation of the most dominant carrier of the output signal from amplifier 106 is provided by $PLL_2$. It should be noted that the most dominant carrier of the output signal from amplifier 106 is, typically, the second most dominant carrier of input signal $V_i(t)$.

Since $PLL_3$ is substantially the same as $PLL_1$ and $PLL_2$, demodulation of the third most dominant carrier of input signal $V_i(t)$ is provided by $PLL_3$. The input of $PLL_3$ is coupled to the output of variable-gain amplifier 116. One input of variable-gain amplifier 116 is coupled to the output of the VCO forming a part of $PLL_2$ (not shown). The other input of difference amplifier 116 is coupled to the output of variable-gain amplifier 106 via delay 115 Again, the output signal from variable-gain amplifier 116 is the input signal $V_i(t)$ with the first two most-dominant carriers suppressed.

To the extent that the strength of the individual carriers of input signal $V_i(t)$ permit, any number of individual demodulations of the carriers of $V_i(t)$ can be obtained as each such carrier becomes dominant in later stages of the receiving system of the present invention. Thus, recovery of the information contained in the modulation of all carriers of $V_i(t)$, in descending order of dominance, is obtained.

Figure 2:
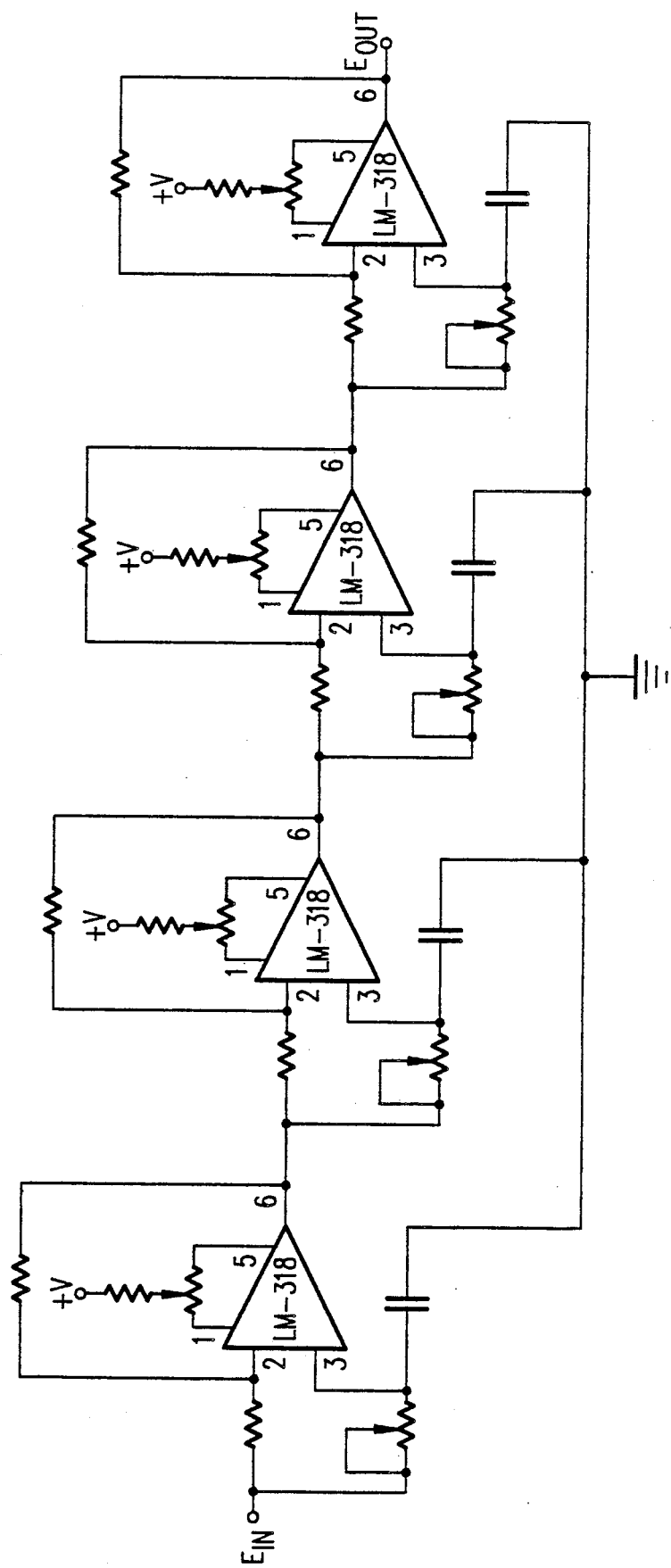
FIG. 2 is a block diagram of the variable delay employed in the system of FIG. 1.

Variable delay 105 may also be merely a variable-phase shift circuit for appropriately adjusting the phase of the output from the previous stage of receiving system 10 for coherence with the output of VCO 104. Delay 105 may use operational amplifier circuit techniques in order to alter the signal phase in a precise and predictable manner. Thus, variable delay 105 may include four (4) LM-318 operational amplifier stages, where each stage has the possibility of continuously variable phase change from 0° to 90°, as shown in FIG. 2. Alternatively, variable delay 105 may comprise circuits or systems creating delay directly (e.g. switched capacitor filters).

Figure 3:
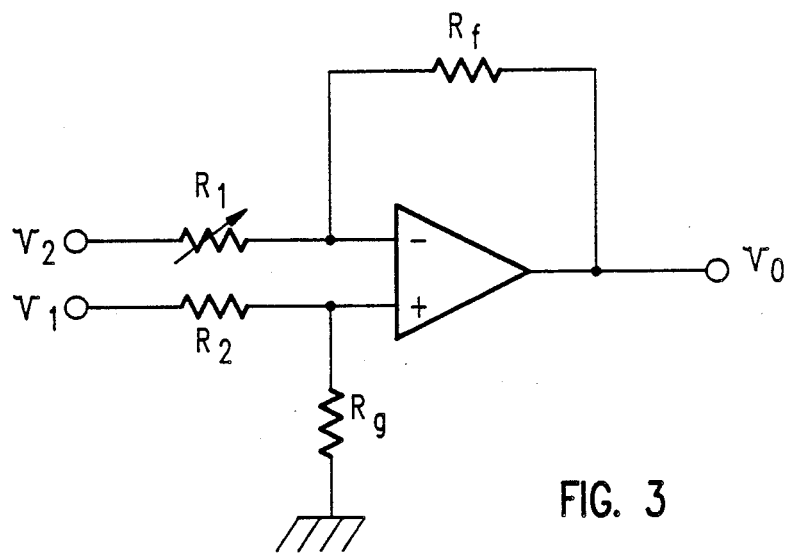
FIG. 3 is a block diagram of the variable-gain difference amplifier employed in the system of FIG. 1.

Variable-gain difference amplifier 107 may be any circuit suitable for combining a signal having the same amplitude and frequency as one component of another signal. Such circuits are well known and may include an LM-318 operational amplifier configured as shown in FIG. 3.

Figure 4:
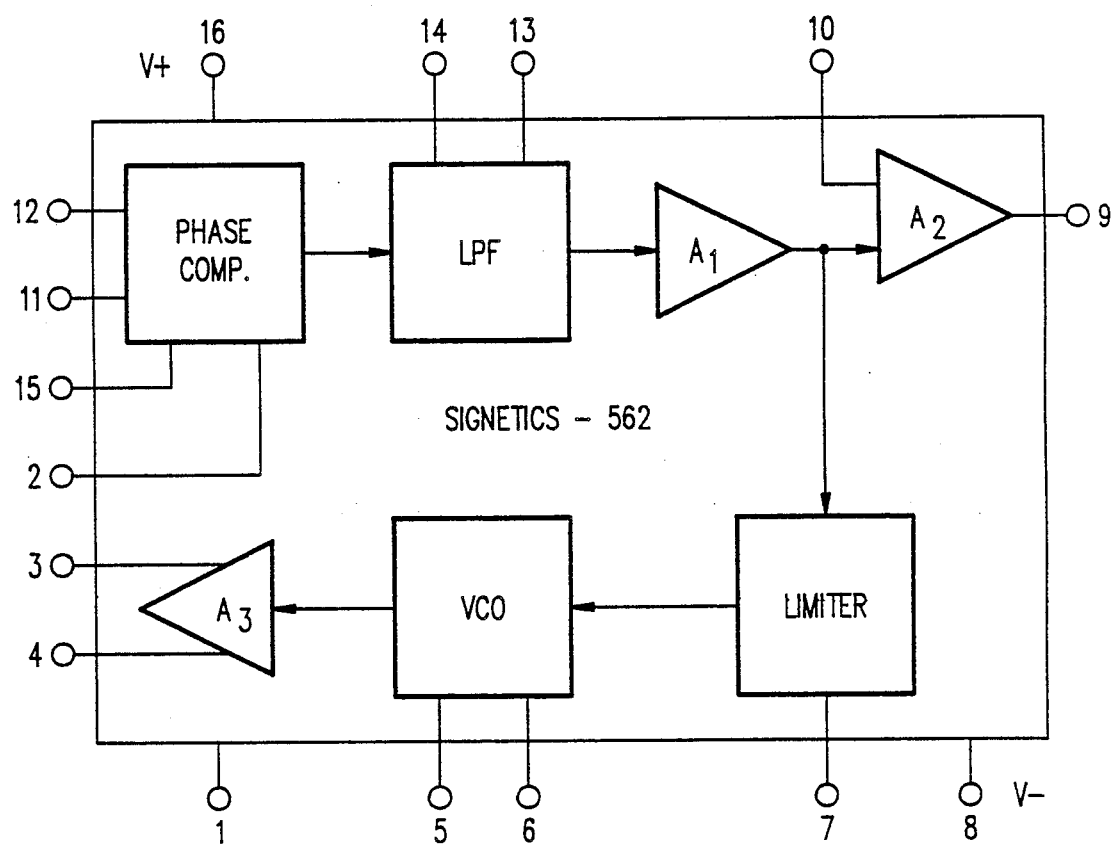
FIG. 4 is a block diagram of the PLL employed in the system of FIG. 1.

Phase-locked loops, $PLL_1$ ... $PLL_n$, are conventional, each of which consisting of such well known components as a mixer, a lowpass filter and a reference voltage-controlled oscillator for producing a reference or replica signal. Typically, all of the components of a PLL are integrated as a single semiconductor product, such as part number 562, manufactured by Signetics, Inc., which may be used in the present invention as shown in FIG. 4.

When the VCO follows the frequency change of $V_i(t)$, the VCO output is the frequency of the dominant component of $V_i(t)$ because of capture effect.

Input signal $V_i(t)$ is given by the following relation:

$$V_i(t) = B_1\cos\left[\omega_1 t + \int_0^t m_1(a)da\right]$$
$$+ B_2\cos\left[(\omega_1 + \epsilon_2)t + \int_0^t m_2(a)da\right]$$
$$\vdots$$
$$+ B_n\cos\left[(\omega_1 + \epsilon_n)t + \int_0^t m_n(a)da\right]$$

If $s_1(t) = B_1\cos\left[\omega_1 t + \int_0^t m(a)da\right]$, the most dominant signal component of $V_i(t)$, $$\text{and } j_2(t) = B_2\cos\left[(\omega_1 + \epsilon_2)t + \int_0^t m_2(a)da\right]$$
$$+ B_3\cos\left[(\omega_1 + \epsilon_3)t + \int_0^t m_3(a)da\right]$$
$$\vdots$$
$$+ B_n\cos\left[(\omega_1 + \epsilon_n)t + \int_0^t m_n(a)da\right],$$

remaining successively-dominant signal components of $V_i(t)$, $=s_2(t)+s_3(t)+\cdots+s_n(t)$ then, $V_i(t)=s_1(t)+j_2(t)$.

Modulation components, $m_1 \ldots m_n$, are arbitrary. Carrier frequencies, $f_1, f_2 \ldots f_n$ where $f_k = (\omega_1 + \epsilon_k)/2\pi$ $H_z$ are typically in the same band. If all other components of $V_i(t)$, namely $j_2(t)$, individually do not exceed in amplitude the carrier signal $s_1(t)$, then the output $x_1(t)$ of PLL$_1$ is equal to $m_1(t)$ because of the capture effect of the first demodulator. Since message $m_1(t)$ is recovered from the dominant carrier of $V_i(t)$, and since VCO 104 is a frequency modulator itself being modulated by $m_1(t)$, then $y_1(t)$ of FIG. 1 is a replica of the dominant carrier of $V_i(t)$.

Referring again to FIG. 1, the delays and variable-gain summers are adjusted to minimize the level of previously dominant signals present at the input of the PLL of interest. Owing to the capture effect of subsequent FM demodulator stages, complete suppression of the undesired signal components is unnecessary, i.e., it is not necessary that $z_k(t)$ equals $j_k(t)$, where $z_k(t)$ is a signal in which $s_{k+1}(t)$ is the dominant component. Rather, it is only necessary that the level of $s_k(t)$ merely exceed the level of all other signal components of $j_k(t)$ where k is any integer in the range 1, 2, ... n, in order to recover information from any component of $V_i(t)$.

The present invention also incorporates power division multiplexing whereby a number of messages (customers) share transmitter power with each other using the same frequency band simultaneously. This concept is consistent with other well understood and implemented techniques such as time division multiplexing and frequency division multiplexing.

With reference to FIG. 1, the average power of $V_i(t)$ is distributed among its components $s_1(t), s_2(t), \cdots s_N(t)$. The greater share of this total average power arises from $s_1(t)$ because it is the dominant signal. Likewise, the average power of $s_j(t)$ exceeds that of $s_{j+1}(t)$ where $j=2,3,\cdots N$. In this manner, the total average power is allocated to the various components of $V_i(t)$ or multiplexed among the various messages in that assigned FM band all of which is being used by each customer. Since a power level is assigned to each user, the result is power division multiplexing in the same sense that frequency band assignment to each user is frequency division multiplexing and time slot assignment to each user is time division multiplexing.

While the present invention has been particularly shown and described with respect to a preferred embodiment thereof, it should be understood by those skilled in the art that changes in form and detail may be made without departing from the spirit of the invention or exceeding the scope of the appended claims. In particular, for example, this invention may be used for phase modulated carriers as well as for FM carriers.

I claim:

1. A signal receiving system for receiving an input signal having a plurality of modulated carrier signals included therein, said system comprising:

first phase lock loop means for receiving said input signal, said first phase lock loop means for generating a first signal representing the demodulated message of the most dominant carrier signal of said input signal and for generating a first replica signal of said most dominant carrier signal;

delay means coupled to said first phase lock loop means for receiving said input signal, said delay means for producing a delayed signal identical to said input signal, said delayed signal being selectively delayed with respect to said input signal;

output means coupled to said delay means and to said first phase lock loop means for receiving and combining said delayed signal produced by said delay means and said replica signal generated by said first phase lock loop means, said output means for producing an output signal representing said input signal for said most dominant carrier signal suppressed; and second phase lock loop means coupled to said output means for receiving said output signal produced thereby and for generating a second signal representing the demodulated message of the second most dominant carrier signal of said input signal and for producing a second replica signal of said second most dominant carrier signal.

2. The signal receiving system as in claim 1 wherein said first phase lock loop means comprises:

mixer means having first and second input ports, said input signal coupled to said first input port and said first replica signal coupled to said second input port, said mixer means combining said input signal and said replica signal for producing signals representing the sum and the difference of said input and first replica signals;

low pass filter means coupled to said mixer means for receiving and filtering said signals produced by said mixer means for producing said first signal representing said demodulated message of said most dominant carrier signal;

oscillator means coupled to said low pass filter means for generating a signal having a frequency substantially equal to the frequency of said most dominant carrier signal, said oscillator means responsive to said first signal for modulating said signal for producing said first replica signal of said most dominant carrier signal.

3. The signal receiving system as in claim 2 wherein said oscillator means comprises a voltage controlled oscillator.

4. The signal receiving system as in claim 2 wherein said second phase lock loop means comprises substantially identical components as said first phase lock loop means, said second phase lock loop means being tuned to lock at the frequency of said second most dominant carrier signal.

5. The signal receiving means as in claim 1 wherein said delay means comprises a plurality of amplifier stages, each said amplifier stage providing selectable continuously variable phase change over a predetermined range.

6. The signal receiving means as in claim 2 wherein said output means comprises a variable gain differential amplifier having a first input port coupled to said delay means for receiving said delayed signal and a second input port coupled to said first phase lock loop means for receiving said first replica signal, said differential amplifier combining said delayed signal and said first replica signal for producing said output signal, said output signal representing said input signal with said most dominant carrier signal suppressed.

7. Apparatus as in claim 1 wherein said first replica signal is given by the relation:

$$s_1(t) = B_1 \cos\left[\omega_1 t + \int_o^t m_1(a)da\right]$$

where $\omega_1$ is the carrier frequency in radians/sec and $m_1(a)$ is the modulation component of said replica signal.

8. Apparatus as in claim 7 wherein said first signal is $m_1(t)$.

9. Apparatus for recovering information from an input signal having a plurality of modulated carrier signals, said apparatus comprising;

a plurality of successive phase lock loop means for generating a plurality of first signals representing the demodulated message of the most dominant carrier signal received by each of said plurality of successive phase lock loop means and for generating a plurality of replica signals representative of said most dominant carrier signal received;

a plurality of output means, each of said output means coupled between an immediately preceding phase lock lop means and a next successive phase lock loop means and having first and second input ports, said first input port coupled to said immediately preceding phase lock loop means, and each of said output means having an output port coupled to said next successive phase lock loop means; and a plurality of delay means, a first one of said delay means coupled to said second input port of a first one of said output means for receiving said input signal and producing a delayed signal identical to said input signal and being selectively delayed with respect to said input signal, a different one of the remaining delay means coupled between said output port of an immediately preceding output means for receiving output signals therefrom and said second input port of a next successive output means, said plurality of delay means for producing delayed signals identical to said received output signals and being selectively delayed with respect to said received output signals;

each of said plurality of output means for receiving and combining said replica signal and said delayed signal and for producing said output signal, said output signal having the immediately preceding most dominant carrier signal suppressed, said output signal constituting the input signal for the next successive phase lock loop means and the next successive delay means.

10. Apparatus as in claim 9 wherein each of said phase lock loop means comprise:

mixer means having first and second input ports, said input signal coupled to said first input port and said replica signal coupled to said second input port, said mixer means combining said input and said replica signals for producing signals representing the sum and difference of said input and said replica signals;

filter means coupled to said mixer means for receiving and filtering said signals produced by said mixer means and for producing said first signal representing the demodulated message of the most dominant carrier signal received by said phase lock loop means; and oscillator means coupled to said filter means and to said second input port of said mixer means, said oscillator means for generating a signal having the frequency of said most dominant carrier signal received by said phase lock loop means, said oscillator means responsive to said first signal to modulate said signal for producing said replica signal of said most dominant carrier signal received by said phase lock loop means.

11. Apparatus as in claim 10 wherein said oscillator means comprises a voltage controlled oscillator.

12. Apparatus for receiving a plurality of power division multiplexed, modulated carrier signals, said apparatus comprising:

a plurality of demodulator means for producing a plurality of first signals, each of said first signals representing the demodulated message of the most dominant carrier signal received by each of said plurality of demodulator means, and for producing a plurality of replica signals, each of said replica signals representative of said most dominant carrier signals; and a plurality of output means being coupled to respective ones of said demodulator means for receiving and combining said first signals and said replica signals produced thereby, and for producing a plurality of output signals, each of said output signals having the next successively dominant carrier signal of said input signal suppressed.

13. Apparatus for receiving an input signal having a plurality of power division multiplexed modulated carrier signals included therein, said system comprising:

first demodulator means for receiving the input signal and for producing a signal representing the demodulated message of the most dominant carrier signal of said input signal, and for producing a replica signal of said dominant carrier signal;

delay means coupled to the demodulator means for receiving the input signal, and for producing a first signal identical to said input signal except that said first signal is selectively delayed with respect to said input signal;

output means, coupled to the delay means and to the demodulator means, for receiving and combining said first signal produced by said delay means and said replica signal produced by said demodulator means, and for producing an output signal representing the input signal with the most dominant carrier suppressed; and second demodulator means coupled to said output means for receiving the output signal produced thereby, for producing a signal representing the demodulated message of the second most dominant carrier of said input signal, and for producing a replica signal of said second most dominant carrier signal.

14. Apparatus as in claim 13 further including:

a plurality of demodulator means each for producing a signal representing the demodulated message of the next successively dominant carrier signal in said input signals, and for producing a replica signal of said next successively dominant signals;

a plurality of output means; and a plurality of delay means having an input each respectively coupled to the output of one of said output means for producing first signals identical to signals received therefrom selectively delayed with respect to said received signals;

each of said plurality of output means being coupled to one of said demodulator means and one of said delay means for receiving and combining said first and said replica signals produced thereby, and for producing a plurality of output signals having the next successively dominant carrier signal of said input signal suppressed.

15. A method for receiving a plurality of power division multiplexed, modulated carrier signals, said method comprising the steps of:

producing a plurality of signals representing the demodulated message of the most dominant carrier signal received by each of a plurality of demodulator means;

producing a plurality of replicas of said most dominant carrier signals;

producing a plurality of first signals identical to said plurality of modulated carrier signals with the immediately preceding dominant carrier signal suppressed, said first signals being selectively delayed with respect thereto; and combining said pluralities of replica and first signals to produce a plurality of output signals, each of said output signals having the next successively dominant carrier signal of said input signal suppressed, coupled to one of said demodulator means and one of said delay means for receiving and combining signals produced thereby, and for producing a plurality of output signals, each of said output signals having the next successively dominant carrier signal of said input signal suppressed.

16. A method for receiving an input signal having a plurality of power division multiplexed modulated carrier signals included therein, said method comprising the steps of:

producing a signal representing the demodulated message of the most dominant carrier signal of said input signal;

producing a replica signal of the most dominant carrier signal;

producing a first signal identical to said input signal except that said first signal is selectively delayed with respect to said input signal;

combining said replica and first signals to produce an output signal representing the input signal with the most dominant carrier suppressed; and producing a signal representing the demodulated message of the second most dominant carrier signal of said input signal.

17. The method as in claim 16 further including the steps of:

producing a plurality of signals representing the demodulated message of the next successively dominant carrier signal in said input signal;

producing a plurality of replicas of the next successively dominant carrier signals;

producing a plurality of first signals identical to said input signal with the immediately preceding dominant signals suppressed, said first signals being selectively delayed with respect thereto; and combining said pluralities of replica and first signals to produce a plurality of output signals, each of said output signals having the next successively dominant carrier signal of said input signal suppressed.

* * * * *